(12) United States Patent
Worledge et al.

(10) Patent No.: US 12,063,868 B2
(45) Date of Patent: Aug. 13, 2024

(54) LOW RA NARROW BASE MODIFIED DOUBLE MAGNETIC TUNNEL JUNCTION STRUCTURE

(71) Applicant: International Business Machines Corporation, Armonk, NY (US)

(72) Inventors: Daniel Worledge, San Jose, CA (US); Guohan Hu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 499 days.

(21) Appl. No.: 17/204,403

(22) Filed: Mar. 17, 2021

(65) Prior Publication Data

US 2022/0302368 A1    Sep. 22, 2022

(51) Int. Cl.
*H10N 50/80*  (2023.01)
*H10B 61/00*  (2023.01)
*H10N 50/85*  (2023.01)

(52) U.S. Cl.
CPC ............. *H10N 50/80* (2023.02); *H10B 61/00* (2023.02); *H10N 50/85* (2023.02)

(58) Field of Classification Search
CPC ........ H10N 50/80; H10N 50/85; H10N 50/10; H10B 61/00
See application file for complete search history.

(56) References Cited

U.S. PATENT DOCUMENTS

| | | | |
|---|---|---|---|
| 6,469,926 B1 * | 10/2002 | Chen | ...................... B82Y 25/00 365/158 |
| 6,822,838 B2 | 11/2004 | Lin et al. | |
| 7,230,265 B2 | 6/2007 | Kaiser et al. | |
| 7,430,135 B2 | 9/2008 | Huai et al. | |
| 7,576,956 B2 | 8/2009 | Huai | |
| 8,686,484 B2 * | 4/2014 | Whig | ...................... H10N 50/85 257/295 |
| 8,981,505 B2 | 3/2015 | Moriyama et al. | |
| 9,093,640 B2 | 7/2015 | Aggarwal et al. | |
| 9,548,442 B2 | 1/2017 | Aggarwal et al. | |
| 9,553,258 B2 | 1/2017 | Whig et al. | |
| 10,147,872 B2 | 12/2018 | Kardasz et al. | |
| 10,381,550 B1 | 8/2019 | Duan et al. | |

(Continued)

FOREIGN PATENT DOCUMENTS

| | | |
|---|---|---|
| CN | 104134748 A | 11/2014 |
| CN | 105374936 A | 3/2016 |

(Continued)

OTHER PUBLICATIONS

International Search Report dated Jan. 22, 2021, received in a related corresponding foreign application, 11 pages.

(Continued)

*Primary Examiner* — Jay C Kim
*Assistant Examiner* — Woo K Lee
(74) *Attorney, Agent, or Firm* — Scully, Scott, Murphy & Presser, P.C.; Daniel P. Morris, Esq.

(57) ABSTRACT

A modified double magnetic tunnel junction (mDMTJ) structure is provided which includes a narrow base and the use of a spin diffusion layer (i.e., non-magnetic, spin-conducting metallic layer) which gives a low resistance-area product (RA) for the tunnel barrier layer that forms an interface with the spin diffusion layer.

24 Claims, 3 Drawing Sheets

(56) References Cited

U.S. PATENT DOCUMENTS

| | | |
|---|---|---|
| 10,468,455 B2 | 11/2019 | Hu et al. |
| 10,522,746 B1 | 12/2019 | Sundar et al. |
| 10,665,777 B2 | 5/2020 | Kardasz et al. |
| 10,797,225 B2 | 10/2020 | Sundar et al. |
| 10,964,468 B2 | 3/2021 | Salahuddin et al. |
| 2007/0019463 A1 | 1/2007 | Saito et al. |
| 2010/0314673 A1 | 12/2010 | Yamane et al. |
| 2017/0098762 A1 | 4/2017 | Worledge |
| 2017/0294482 A1 | 10/2017 | Hu et al. |
| 2018/0226574 A1 | 8/2018 | Whig et al. |
| 2019/0006583 A1 | 1/2019 | Tahmasebi |
| 2019/0088713 A1 | 3/2019 | Swerts |
| 2022/0131067 A1 | 4/2022 | Kalitsov et al. |

FOREIGN PATENT DOCUMENTS

| | | |
|---|---|---|
| JP | H11177161 A | 7/1999 |
| JP | 2006156685 A | 6/2006 |
| JP | 2010147213 A | 7/2010 |
| JP | 2011003617 A | 1/2011 |
| WO | 2012170689 A1 | 12/2012 |

OTHER PUBLICATIONS

Wang, G., et al., "Compact Modeling of Perpendicular-Magnetic-Anisotropy Double-Barrier Magnetic Tunnel Junction With Enhanced Thermal Stability Recording Structure", IEEE Transactions on Electron Devices, May 2019, pp. 2431-2436, vol. 66, No. 5.

List of IBM Patents or Patent Applications Treated as Related, dated Mar. 17, 2021, 2 pages.

Notice of Allowance dated Sep. 21, 2022 received in U.S. Appl. No. 17/204,424, not enclosed.

Office Action dated Apr. 15, 2021 received in U.S. Appl. No. 16/671,995, Not Enclosed.

International Search Report dated Jul. 1, 2022, received in a related foreign application, 10 pages.

English-language translation of a Japanese Office Action dated Apr. 2, 2024, received in a corresponding foreign application, namely Japanese Patent Application No. 2022-524731, 7 pages.

* cited by examiner

LOW RA NARROW BASE MODIFIED DOUBLE MAGNETIC TUNNEL JUNCTION STRUCTURE

RELATED APPLICATIONS

The present application is related to U.S. Ser. No. 16/671,995, filed Nov. 1, 2019 and entitled "MODIFIED DOUBLE MAGNETIC TUNNEL JUNCTION STRUCTURE SUITABLE FOR BEOL INTEGRATION", filed on the same date as the present application and entitled "AMORPHOUS SPIN DIFFUSION LAYER FOR MODIFIED DOUBLE MAGNETIC TUNNEL JUNCTION STRUCTURE". The entire content of each of the above mentioned applications is incorporated herein by reference.

BACKGROUND

The present application relates to magnetoresistive random access memory (MRAM). More particularly, the present application relates to a modified double magnetic tunnel junction (mDMTJ) structure that can improve the performance of spin-transfer torque (STT) MRAM and which can be integrated into the back-end-of-the-line (BEOL) processing of semiconductor technologies (such as CMOS technologies).

Figure 1:
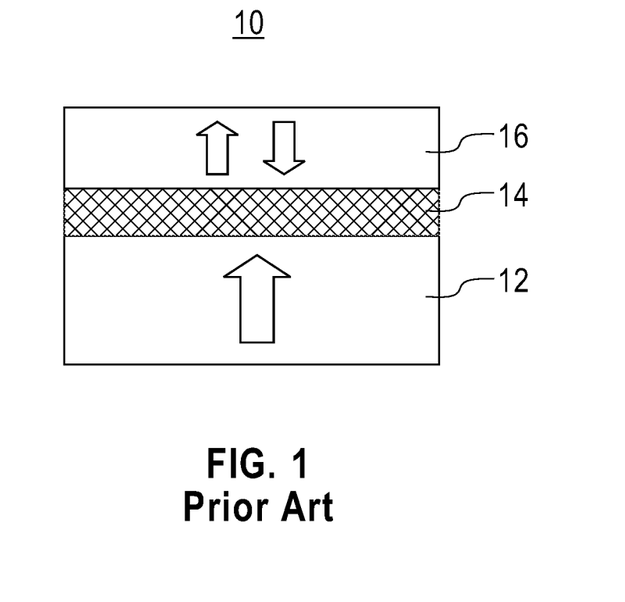
FIG. 1 is a cross sectional view of a prior art MTJ structure.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier layer). One of the two plates (i.e., the magnetic reference or pinned layer) is a magnet whose magnetic moment direction is set to a particular direction; the other plate's (i.e., the magnetic free layer's) magnetization can be changed in at least two different directions, representing different digital states such as 0 and 1 for memory applications. In MRAM, such elements may be referred to as a magnetic tunnel junction (MTJ) structure. FIG. 1 illustrates a prior art MTJ structure 10 that includes a magnetic reference layer 12, a tunnel barrier layer 14 and a magnetic free layer 16. The sole arrow shown in the magnetic reference layer 12 illustrates a possible orientation of that layer, and the two arrows in the magnetic free layer 16 illustrate that the orientation in that layer can be switched.

In the MTJ structure 10 of FIG. 1, the magnetization of the magnetic reference layer 12 is fixed in one direction (say pointing up), while the direction of the magnetic free layer 16 can be "switched" by some external forces, such as a magnetic field or a spin-transfer torque generating charge current. A smaller current (of either polarity) can be used to read the resistance of the device, which depends on the relative orientations of the magnetizations of the magnetic free layer 16 and the magnetic reference layer 12. The resistance is typically higher when the magnetizations are anti-parallel, and lower when they are parallel (though this can be reversed, depending on the material).

One type of MRAM that can use the MTJ structure 10 shown in FIG. 1 is STT MRAM. STT MRAM has the advantages of lower power consumption and better scalability over conventional MRAM which uses magnetic fields to flip the active elements. In STT MRAM, spin-transfer torque is used to flip (switch) the orientation of the magnetic free layer. For an STT MRAM device, a current passing through the MTJ structure is used to switch, or "write" the bit-state of the MTJ memory element. A current passing down through the MTJ structure makes the magnetic free layer 16 parallel to the magnetic reference layer 12, while a current passed up through the MTJ structure makes the magnetic free layer 16 anti-parallel to the magnetic reference layer 12.

Figure 2:
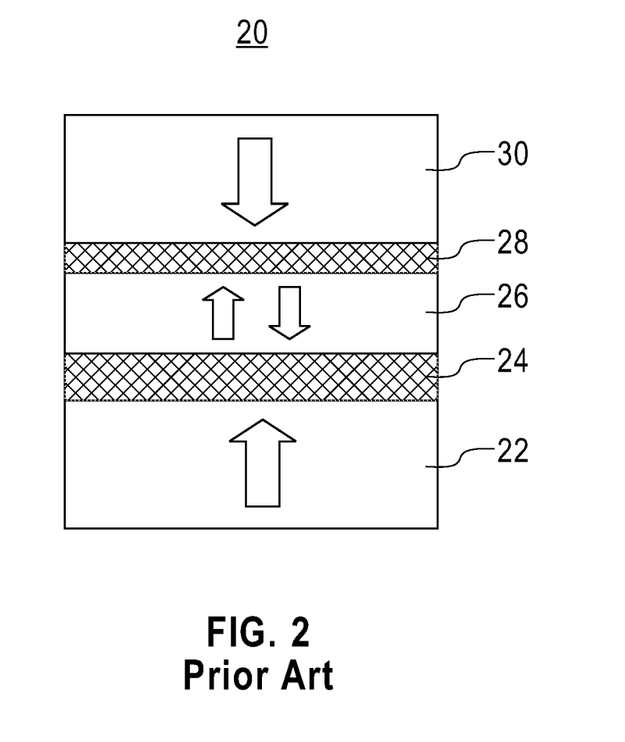
FIG. 2 is a cross sectional view of a prior art DMTJ structure.

In STT MRAMs, it is desirable to reduce the switching current to match a small transistor size, so as to improve the memory area density. One method of reducing the switching current by about 2× is the concept of a double magnetic tunnel junction (DMTJ) structure 20 such as is shown in FIG. 2. The DMTJ structure 20 of FIG. 2 includes a first magnetic reference layer 22, a first tunnel barrier layer 24, a magnetic free layer 26, a second tunnel barrier layer 28 and a second magnetic reference layer 30. The sole arrow shown in each of the first magnetic reference layer 22 and the second magnetic reference layer 30 illustrates a possible orientation of the layer, and the two arrows in the magnetic free layer 26 illustrate that the orientation in that layer can be switched. One drawback of the DMTJ structure shown in FIG. 2 is, while it reduces the switching current, it also reduces tunnel magnetoresistance (TMR), hampering efficient readout of the device.

There is thus a need for providing a DMTJ structure which has reduced switching current, while mitigating the reduction of TMR within the structure such that the DMTJ structure exhibits efficient switching (at a low current) and speedy readout (high TMR).

SUMMARY

A modified double magnetic tunnel junction (mDMTJ) structure is provided which includes a narrow base and the use of a spin diffusion layer (i.e., a non-magnetic, spin-conducting metallic layer) which gives a low resistance-area product (RA) for the tunnel barrier layer that forms an interface with the spin diffusion layer. By "narrow base" it is meant that the diameter of the junction is roughly the same at the bottom of the junction and at the top of the junction. By "low RA" it is meant a RA of equal to, or less than, 1 Ohm-micron$^2$. The mDMTJ structure of the present application exhibits efficient switching (at a low current) and speedy readout (high TMR). By "low current" it is meant a current of less than a current required by a typical single MTJ device for accomplishing the same error-free write. In some embodiments, the low current could reach, or is below, 20 to 50μA. By "high TMR" it is meant a tunnel magnetoresistance of greater value than a typical DMTJ device would accomplish. In some embodiments, the high TMR could reach, or exceeds, 100-200%.

In one aspect of the present application, a mDMTJ structure that exhibits efficient switching and speedy readout is provided. In one embodiment, the mDMTJ structure includes a first magnetic reference layer, a first tunnel barrier layer having a first surface contacting a surface of the first magnetic reference layer, a non-magnetic, spin-conducting metallic layer (i.e., a spin diffusion layer) having a first surface contacting a second surface of the first tunnel barrier layer which is opposite the first surface of the first tunnel barrier layer, a magnetic free layer having a first surface contacting a second surface of the non-magnetic, spin-conducting metallic layer which is opposite the first surface of the non-magnetic, spin-conducting metallic layer, a second tunnel barrier layer having a first surface contacting a second surface of the magnetic free layer which is opposite the first surface of the magnetic free layer, and a second magnetic reference layer having a first surface contacting a second surface of the second tunnel barrier layer which is opposite the first surface of the second tunnel barrier layer. In accordance with the present application, the first tunnel barrier layer has a first resistance-area product, RA, the second tunnel barrier layer has a second RA, and the first RA is at least 5 times lower than the second RA.

In another aspect of the present application, a STT MTJ memory element is provided. In one embodiment, the STT MTJ memory element includes a mDMTJ structure sandwiched between a first electrode and a second electrode. The mDMTJ structure includes a first magnetic reference layer, a first tunnel barrier layer having a first surface contacting a surface of the first magnetic reference layer, a non-magnetic, spin-conducting metallic layer having a first surface contacting a second surface of the first tunnel barrier layer which is opposite the first surface of the first tunnel barrier layer, a magnetic free layer having a first surface contacting a second surface of the non-magnetic, spin-conducting metallic layer which is opposite the first surface of the non-magnetic, spin-conducting metallic layer, a second tunnel barrier layer having a first surface contacting a second surface of the magnetic free layer which is opposite the first surface of the magnetic free layer, and a second magnetic reference layer having a first surface contacting a second surface of the second tunnel barrier layer which is opposite the first surface of the second tunnel barrier layer. In accordance with the present application, the first tunnel barrier layer has a first resistance-area product, RA, the second tunnel barrier layer has a second RA, and the first RA is at least 5 times lower than the second RA.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

U.S. Ser. No. 16/671,995 mentioned above provides a mDMTJ structure that includes two tunnel barrier layers and two magnetic reference layers. This mDMTJ structure has a lower switching current than the single tunnel junction device, since spin torque is applied to the magnetic free layer from both top and bottom interfaces. In order to reduce the parasitic resistance of the first tunnel barrier layer (which reduces the magnetoresistance), the first tunnel barrier layer is made wider than the second tunnel barrier layer, See FIGS. 5A, 5B, 7A and 7B of U.S. Ser. No. 16/671,995. By "wider" it is meant that the diameter of the first tunnel barrier is 2-4 times larger than the diameter of the second tunnel barrier. A spin diffusion layer, which is a non-magnetic, spin-conductive metal, is used to collect the spins that tunnel through the first tunnel barrier layer and transport them to the magnetic free layer. The spin diffusion layer allows the first tunnel barrier layer to be a large area (and hence low resistance) while keeping the magnetic free layer to be a small area (and hence have a low switching current).

The present application provides a mDMTJ structure which includes a narrow base, as defined above, and the use of a spin diffusion layer (hereinafter referred to as a non-magnetic, spin-conducting metallic layer) which gives a low RA, as defined above, for the tunnel barrier layer (i.e., first tunnel barrier layer) that forms an interface with the non-magnetic, spin-conducting metallic layer. The mDMTJ structure of the present application exhibits efficient switching (at a low current, as defined above) and speedy readout (high TMR, as defined above).

In the present application, the non-magnetic, spin-conducting metallic layer material and the first tunnel barrier material are selected such that they collectively provide a low RA, as defined above and preferably less than, 1 Ohm-micron$^2$, for a tunnel barrier thickness which is not thick enough to consistently avoid pin holes. For example, for MgO tunnel barrier layers, the tunnel barrier layer typically needs to be about 1 nm thick to consistently avoid pinholes. For most electrode materials (including most spin diffusion layer materials and most magnetic materials, like CoFeB) this will give an RA around 5-20 Ohm-micron$^2$. However, some non-magnetic, spin-conducting metallic layer materials (as defined below) give a low RA that is less than 1 Ohm-micron$^2$, yet still supply spin torque. This low RA barrier allows the use of a narrow base, so that the entire structure has roughly the same diameter. This avoids the complexity of processing a wide base modified double magnetic tunnel junction, substantially reducing cost.

Figure 3:
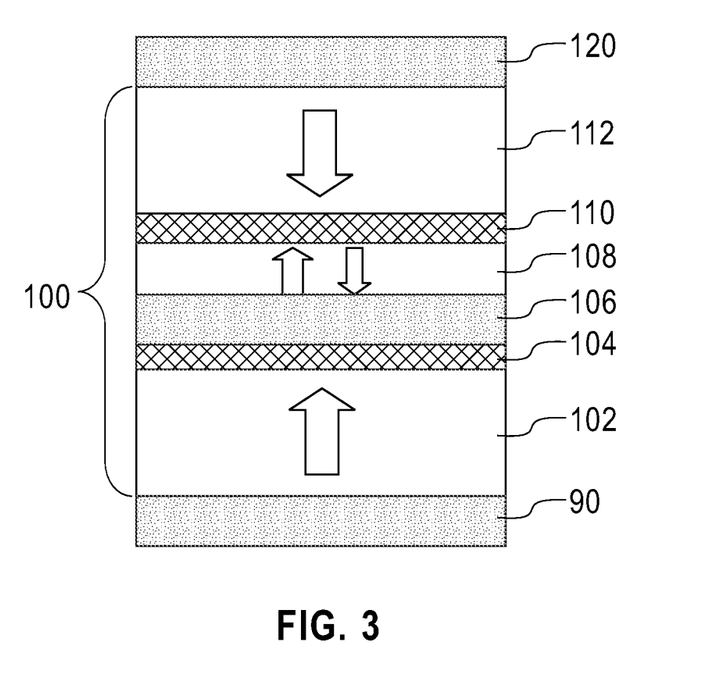
FIG. 3 is a cross sectional view of a mDMTJ structure in accordance with an embodiment of the present application.
Figure 5:
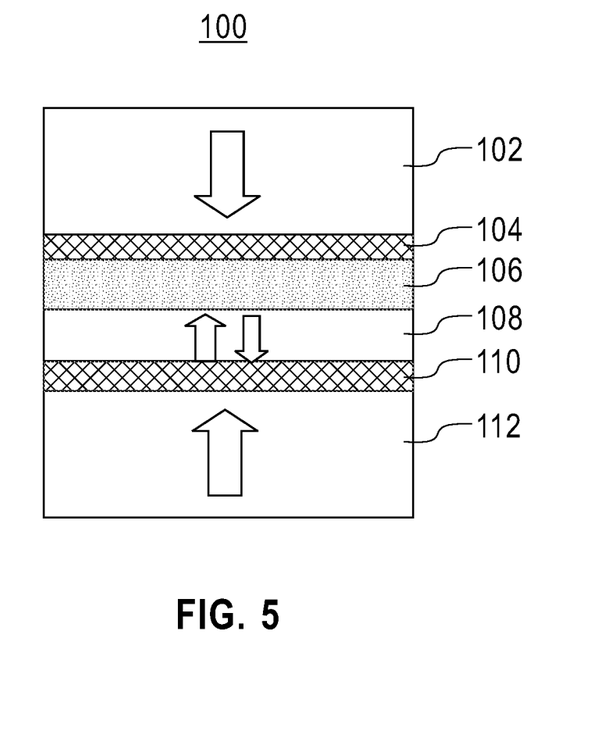
FIG. 5 is a cross sectional view of a mDMTJ structure in accordance with an embodiment of the present application.

Notably, the present application provides mDMTJ structures 100 as shown, for example, in FIGS. 3 and 5. The mDMTJ structures 100 can be integrated in the BEOL and used as a component of a STT MRAM. The mDMTJ structures 100 of the present application and as shown, for example, in FIGS. 3 and 5 include a first magnetic reference layer 102, a first tunnel barrier layer 104 having a first surface contacting a surface of the first magnetic reference layer 102, a non-magnetic, spin-conducting metallic layer 106 having a first surface contacting a second surface of the first tunnel barrier layer 104 which is opposite the first surface of the first tunnel barrier layer 104, a magnetic free layer 108 having a first surface contacting a second surface of the non-magnetic, spin-conducting metallic layer 106 which is opposite the first surface of the non-magnetic, spin-conducting metallic layer 106, a second tunnel barrier layer 110 having a first surface contacting a second surface of the magnetic free layer 108 which is opposite the first surface of the magnetic free layer 108, a second magnetic reference layer 112 having a first surface contacting a second surface of the second tunnel barrier layer 110 which is opposite the first surface of the second tunnel barrier layer 110.

In accordance with the present application, the first tunnel barrier layer 104 has a first resistance-area product, RA, the second tunnel barrier layer 110 has a second RA, and the first RA is at least 5 times lower, more typically at least 7 times lower, and even more typically 10 times lower, than the second RA. In some embodiments of the present application, the first RA of the first tunnel barrier layer 110 is equal to, or less than, 1 Ohm-micron$^2$. In other embodiments of the present application, the first RA of the first tunnel barrier layer 110 is from 0.1 Ohm-micron$^2$ to 2 Ohm-micron$^2$. It is noted that despite the low RA, the first tunnel barrier layer 104 still provides spin torque to the magnetic free layer 108.

In the mDMTJ structures of the present invention, the non-magnetic, spin-conducting metallic layer 106 is a spin-conserving metallic material with a long spin-flip scattering lifetime and a low RA that is less than 1 Ohm-micron$^2$. By "long spin-flip scattering lifetime" it is meant that electrons can travel more than 10 nanometers before their spin flips. The non-magnetic, spin-conducting metallic layer 106 receives spin-current that is polarized by the first magnetic reference layer 102 when tunneling across the first tunnel barrier layer 104, and effectively transmits that spin-current to the magnetic free layer 108 assisting STT-inducing switching. At the same time, the non-magnetic, spin-conducting metallic layer 106 reduces to zero the spin polarization of the density-of-states (DOS) at the interface between the non-magnetic, spin-conducting metallic layer 106 and the first tunnel barrier layer 104. Consequently the magnetoresistance across the first tunnel barrier layer 104 is reduced to zero, thus avoiding the magnetoresistance cancellation effect that plagues a prior art DMTJ structure such as is shown, for example, in FIG. 2 of the present application.

This reduction of DOS spin polarization at the interface between the non-magnetic, spin-conducting metallic layer 106 and the first tunnel barrier layer 104 also reduces significantly the spin-current with polarization defined by the magnetic free layer 108 that could enter the first magnetic reference layer 102, thus reducing spin-torque, and STT-related disturbances of the magnetic reference layer 102 from the magnetic free layer 108. The mDMTJ structures 100 of the present application thus exhibit efficient switching (at a low current as defined above), speedy readout (high TMR as defined above), and a reduction to the potential disturbance on reference layer (102)'s magnetic state (disturbance that can cause write-errors as well).

Referring first to FIG. 3, there is illustrated a mDMTJ structure 100 in accordance with an embodiment of the present application. The mDMTJ structure 100 of FIG. 3 includes a first magnetic reference layer 102, a first tunnel barrier layer 104 contacting a surface of the first magnetic reference layer 102, a non-magnetic, spin-conducting metallic layer 106 contacting a surface of the first tunnel barrier layer 104, a magnetic free layer 108 contacting a surface of the non-magnetic, spin-conducting metallic layer 106, a second tunnel barrier layer 110 contacting a surface of the magnetic free layer 108, and a second magnetic reference layer 112 contacting a surface of the second tunnel barrier layer 110. As is shown, the mDMTJ structure 100 of FIG. 3 is located between a first electrode 90 and a second electrode 120. Collectively, the mDMTJ structure 100, the first electrode 90 and the second electrode 120 provide a STT MTJ memory element.

Although not depicted in FIG. 3, or any of the remaining drawings, the mDMTJ structure 100 can be embedded in various dielectric material layers, including interconnect dielectric materials, that are present in the BEOL. Although not depicted in FIG. 3, or any of the remaining drawings, a non-MRAM containing device area can be located laterally adjacent to the MRAM containing device area depicted in the drawings of the present application.

First electrode 90 can be present on a surface (recessed or non-recessed) of an electrically conductive structure such as, for example, a copper-containing structure, that is embedded in an interconnect dielectric material layer of one of the interconnect levels present in the BEOL. The first electrode 90 can be composed of Ta, TaN, Ti, TiN, Ru, RuN, RuTa, RuTaN, Co, CoWP, CoN, W, WN or any combination thereof. The first electrode 90 may also be composed of any other well known electrode material. The first electrode 90 can have a thickness from 2 nm to 25 nm; other thicknesses are possible and can be used in the present application as the thickness of the first electrode 90. The first electrode 90 can be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing, or CMP), or a patterning process (such as, for example, lithography and etching) can follow the deposition of the conductive material that provides the first electrode 90.

Next and as shown in FIG. 3, the mDMTJ structure 100 is formed on the first electrode 90. In FIG. 3, the first magnetic reference layer 102 is located at a bottom portion of the mDMTJ structure 100, and the second magnetic reference layer 112 is located at a top portion of the mDMTJ structure 100. In FIG. 3, each of the first magnetic reference layer 102, the first tunnel barrier layer 104, and the non-magnetic, spin-conducting metallic layer 106 has a first lateral dimension, and each of the magnetic free layer 108, the second tunnel barrier layer 110, and the second magnetic reference layer 112 has a second lateral dimension that is the same as the first lateral dimension. Thus, each of the various layers present in the mDMTJ structure 100 shown in FIG. 3 has an outermost sidewall(s) that is(are) related to each other, either vertically aligned or aligned with a controlled sidewall slope.

The various material layers of the mDMTJ structure 100 can be formed by utilizing one or more deposition processes such as, for example, sputtering, plasma enhanced atomic layer deposition (PEALD), plasma enhanced chemical vapor deposition (PECVD) or physical vapor deposition (PVD) which includes magnetron sputtering. In some embodiments, the various material layers of the mDMTJ structure 100 can be formed without breaking vacuum between the deposition of the various material layers. In other embodiments, the various material layers of the mDMTJ structure 100 can be formed by breaking vacuum between deposition of one or more of the various material layers. In some embodiments of the present application, the non-magnetic, spin-conducting metal layer 106 is formed in separate deposition steps such that a lower portion of the non-magnetic, spin-conducting metal layer 106 is formed and thereafter an upper portion of the non-magnetic, spin-conducting metal layer 106 is formed. The upper and lower portions of the non-magnetic, spin-conducting metal layer 106 are composed of a same non-magnetic, spin-conducting metallic material. The presence of the non-magnetic, spin-conducting metal layer 106 makes it feasible to break vacuum in the middle of forming that material layer, as such same-material metallic interfaces are more readily "healed" via annealing at elevated temperatures (such as 400° C.) and interface-related defect effects minimized.

The first magnetic reference layer 102 has a fixed magnetization. The first magnetic reference layer 102 can be composed of a metal or metal alloy (or a stack thereof) that includes one or more metals exhibiting high spin polarization at the tunnel barrier interface. In alternative embodiments, exemplary metals for the formation of the first magnetic reference layer 102 include iron, nickel, cobalt, chromium, boron, or manganese. Exemplary metal alloys can include the metals exemplified by the above. In another embodiment, the first magnetic reference layer 102 can be a multilayer arrangement having (1) a high spin polarization region formed of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong intrinsic or bulk (as opposed to interface) PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the first magnetic reference layer 102. In some embodiments, the first magnetic reference layer 102 can include a lower magnetic reference layer, a synthetic anti-ferromagnetic coupling layer and an upper magnetic reference layer. This embodiment for the first magnetic reference layer 102 will be described in greater detail herein below in regard to FIG. 4.

The first tunnel barrier layer 104 is configured to provide spin-current, but not contributing to TMR opposing the second tunnel barrier's TMR, when interfaced with the non-magnetic, spin-conducting metallic layer 106. The first tunnel barrier layer 104 is composed of an insulator material such as, for example, magnesium oxide, aluminum oxide, and titanium oxide, or materials of higher electrical tunnel conductance, while preserving spin polarization, such as semiconductors or low-bandgap insulators. In one preferred embodiment, the first tunnel barrier layer 104 is composed of magnesium oxide.

The non-magnetic, spin-conducting metallic layer 106 is composed of a spin-conserving metallic material with a long spin-flip scattering lifetime, as defined above, and that provides an RA in the first tunnel barrier layer 104 that is less than 1 Ohm-micron$^2$. Materials for the non-magnetic, spin-conducting metallic layer 106 include, but are not limited to, pure copper (Cu), copper (Cu) with less than 1% other elements such as, for example, nitrogen (N), boron (B) or beryllium (Be), a copper nitride (CuN) alloy, wherein the nitride content of the CuN alloy is less than 1 atomic percent, or a copper boron (CuB) alloy, wherein the boron content of the CuB alloy is less than 20 atomic percent. The exemplified materials for the non-magnetic, spin-conducting metallic layer 106 are typically used in conjunction with a first tunnel barrier layer 104 that is composed of magnesium oxide to provide the first RA to the first tunnel barrier layer 104.

In the some embodiments of the present application, the non-magnetic, spin-conducting metallic layer 106 material has a selected crystal orientation which can facilitate a high DOS at the interface between the non-magnetic, spin-conducting metallic layer 106 and the first tunnel barrier layer 104. For example, a copper layer (i.e., pure Cu or the Cu containing one of the above mentioned elements) having an FCC 111 texture can be employed in the present application.

The non-magnetic, spin-conducting metallic layer 106 has a thickness that is adequate to transmit a received spin-current into the magnetic free layer 108. In one embodiment, the thickness of the non-magnetic, spin-conducting metallic layer 106 is from 2 nm to 20 nm; although other thicknesses are possible so long as the thickness of the non-magnetic, spin-conducting metallic layer 106 is sufficient to transmit a received spin-current into the magnetic free layer 108.

The magnetic free layer 108 can be composed of a magnetic material (or a stack of magnetic materials) with a magnetization that can be changed in orientation relative to the magnetization orientation of the first magnetic reference layer 102 and the second magnetic reference layer 112. Exemplary magnetic materials for the magnetic free layer 108 include alloys and/or multilayers of cobalt, iron, alloys of cobalt-iron, nickel, alloys of nickel-iron, and alloys of cobalt-iron-boron.

The second tunnel barrier layer 110 is composed of an insulator material and is formed at such a thickness as to provide an appropriate tunneling resistance between the magnetic free layer 108 and the second magnetic reference layer 112. Exemplary materials for the second tunnel barrier layer 110 include magnesium oxide, aluminum oxide, and titanium oxide, or materials of higher electrical tunnel conductance, such as semiconductors or low-bandgap insulators. In some embodiments, the second tunnel barrier layer 110 is composed of a compositionally same insulator material as the first tunnel barrier layer 104. In other embodiments, the second tunnel barrier layer 110 is composed of a compositionally different insulator material than the first tunnel barrier layer 104. The second tunnel barrier layer 110 has a thickness sufficient to avoid pin hole formation.

The second magnetic reference layer 112 also has a fixed magnetization. The second magnetic reference layer 112 can be composed of a metal or metal alloy (or a stack thereof) that includes one or more metals exhibiting high spin polarization. In alternative embodiments, exemplary metals for the formation of the second magnetic reference layer 112 include iron, nickel, cobalt, chromium, boron, or manganese. Exemplary metal alloys can include the metals exemplified by the above. In another embodiment, the second magnetic reference layer 112 can be a multilayer arrangement having (1) a high spin polarization region formed of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong intrinsic or bulk (as opposed to interface) PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the second magnetic reference layer 112. In some embodiments, the second magnetic reference layer 112 can include a lower magnetic reference layer, a synthetic anti-ferromagnetic coupling layer and an upper magnetic reference layer. This embodiment for the second magnetic reference layer 112 will be described in greater detail herein below in regard to FIG. 4.

The second electrode 120 can be composed of one of the conductive metallic materials as the first electrode 90. In some embodiments, the second electrode 120 can be composed of a compositionally same conductive metallic material as the first electrode 90. In another embodiment, the second electrode 120 can be composed of a compositionally different conductive metallic material than the first electrode 90. The second electrode 120 can have a thickness from 2 nm to 25 nm; other thicknesses are possible and can be used in the present application as the thickness of the second electrode 120. The second electrode 120 can be formed by a deposition process such as, for example, sputtering, atomic layer deposition (ALD), chemical vapor deposition (CVD), plasma enhanced chemical vapor deposition (PECVD) or physical vapor deposition (PVD).

Figure 4:
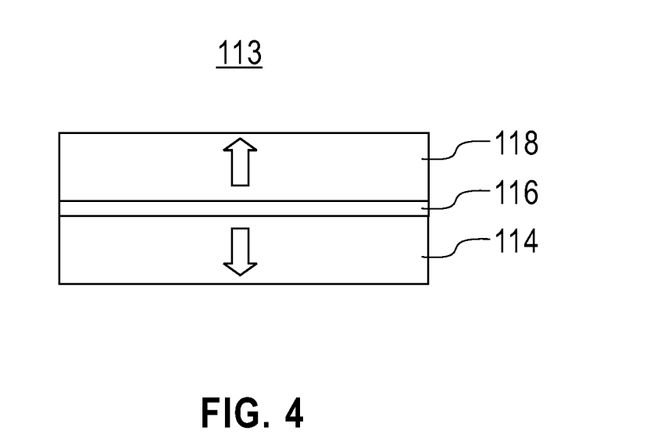
FIG. 4 is a cross sectional view of a magnetic reference layer that can be employed for one, or both, of the first magnetic reference layer and the second magnetic reference layer shown in FIG. 3, the magnetic reference layer including a lower magnetic reference layer, a synthetic anti-ferromagnetic coupling layer and an upper magnetic reference layer; in such applications the reference layer moment direction illustrated in FIG. 3 corresponds to the moment direction of one layer of the synthetic anti-ferromagnetic coupling layer that contacts the tunnel barrier.

Referring now to FIG. 4, there is illustrated a magnetic reference layer 113 that can be employed for one, or both, of the first magnetic reference layer 102 and the second magnetic reference layer 112 shown in FIG. 3, or in FIG. 5. The magnetic reference layer 113 of FIG. 4 includes a lower magnetic reference layer 114, a synthetic anti-ferromagnetic coupling layer 116 and an upper magnetic reference layer 118. The lower magnetic reference layer 114 may be composed of one of the magnetic materials mentioned above for the first or second magnetic reference layers 102, 110. The synthetic anti-ferromagnetic coupling layer 116 is composed of non-magnetic material that can couple in an anti-parallel fashion the lower and upper magnetic layers 114, 118 of the magnetic reference layer 113. Exemplary non-magnetic materials that can be used as the synthetic anti-ferromagnetic coupling layer 116 include, but are not limited to, ruthenium (Ru), iridium (Jr) or rhodium (Rh). In one embodiment, the synthetic anti-ferromagnetic coupling layer 116 can have a thickness from 0.2 nm to 1.2 nm; although other thicknesses are possible and can be used as the thickness of the synthetic anti-ferromagnetic coupling layer 116. The upper magnetic reference layer 118 can be composed of one of the magnetic materials mentioned above for the first or second magnetic reference layers 102, 110. Typically, the upper magnetic reference layer 118 is compositionally different from the lower magnetic reference layer 114.

In one embodiment, the magnetic reference layer 113 is employed as the second magnetic reference layer 112, but not the first magnetic reference layer 102. In another embodiment, the magnetic reference layer 113 is employed as both the second magnetic reference layer 112 and the first magnetic reference layer 102. In yet a further embodiment, the magnetic reference layer 113 is employed as the first magnetic reference layer 102, but not the second magnetic reference layer 112.

Referring now to FIG. 5, there is illustrated a mDMTJ structure 100 in accordance with yet another embodiment of the present application; the mDMTJ structure 100 of FIG. 5 is flipped 180° from the mDMTJ structure shown in FIG. 3 such that the first magnetic reference layer 102 is located at the top of the structure. The mDMTJ structure 100 of FIG. 5 includes a first magnetic reference layer 102, as defined above, a first tunnel barrier layer 104, as defined above, contacting a surface of the first magnetic reference layer 102, a non-magnetic, spin-conducting metallic layer 106, as defined above, contacting a surface of the first tunnel barrier layer 104, a magnetic free layer 108, as defined above, contacting a surface of the non-magnetic, spin-conducting metallic layer 106, a second tunnel barrier layer 110, as defined above, contacting a surface of the magnetic free layer 108, and a second magnetic reference layer 112, as defined above, contacting a surface of the second tunnel barrier layer 110. The mDMTJ structure 100 shown in FIG. 5 illustrates an embodiment in which the first magnetic reference layer 102 is located at a top portion of the mDMTJ structure, and the second magnetic reference layer 112 is located at a bottom portion of the mDMTJ structure.

Although not shown, the DMTJ structure 100 of FIG. 5, is located between a first electrode, as defined above, and a second electrode, as defined below. Collectively, the mDMTJ structure 100, the first electrode and the second electrode provide a STT MTJ memory element.

In FIG. 5, which is an mDMTJ 100 having the first magnetic reference layer 102 located at a top portion of the mDMTJ structure, and the second magnetic reference layer 112 located at a bottom portion of the mDMTJ structure (flipped 180° from the structure shown in FIG. 3), each of the first magnetic reference layer 102, the first tunnel barrier layer 104, and the non-magnetic, spin-conducting metallic layer 106 has a first lateral dimension, and each of the magnetic free layer 108, the second tunnel barrier layer 110, and the second magnetic reference layer 112 has a second lateral dimension that is the same as the first lateral dimension. Thus, each of the various layers present in the mDMTJ structure 100 shown in FIG. 5 has an outermost sidewall(s) that is(are) vertically aligned to each other.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A modified double magnetic tunnel junction (mDMTJ) structure comprising:
a first magnetic reference layer;
a first tunnel barrier layer having a first surface contacting a surface of the first magnetic reference layer;
a non-magnetic, spin-conducting metallic layer having a first surface directly contacting a second surface of the first tunnel barrier layer which is opposite the first surface of the first tunnel barrier layer;
a magnetic free layer having a first surface directly contacting a second surface of the non-magnetic, spin-conducting metallic layer which is opposite the first surface of the non- magnetic, spin-conducting metallic layer;

a second tunnel barrier layer having a first surface contacting a second surface of the magnetic free layer which is opposite the first surface of the magnetic free layer; and a second magnetic reference layer having a first surface contacting a second surface of the second tunnel barrier layer which is opposite the first surface of the second tunnel barrier layer, wherein the first tunnel barrier layer has a first resistance-area product, RA, and the second tunnel barrier layer has a second RA, and wherein the first RA is at least 5 times lower than the second RA.

2. The mDMTJ structure of claim 1, wherein the first RA is equal to, or less than, 1 Ohm-micron$^2$.

3. The mDMTJ structure of claim 1, wherein the non-magnetic, spin-conducting metallic layer provides a low RA that is less than 1 Ohm-micron$^2$ to the first tunnel barrier layer, yet still supplies spin torque.

4. The mDMTJ structure of claim 1, wherein the first tunnel barrier layer is composed of magnesium oxide (MgO), and the non-magnetic, spin-conducting metallic layer is composed of copper (Cu), or mainly of copper (Cu) with less than 1% other elements.

5. The mDMTJ structure of claim 4, wherein the copper has an FCC 111 texture.

6. The mDMTJ structure of claim 1, wherein the first tunnel barrier layer is composed of MgO, and the non-magnetic, spin-conducting metallic layer is composed of a copper nitride (CuN) alloy having a nitride content of less than 1 atomic percent, or a copper boron (CuB) alloy having a boron content of less than 20 atomic percent.

7. The mDMTJ structure of claim 1, wherein the first magnetic reference layer is located at a bottom portion of the mDMTJ structure, and the second magnetic reference layer is located at a top portion of the mDMTJ structure.

8. The mDMTJ structure of claim 7, wherein at least one of the first magnetic reference layer and the second magnetic reference layer comprises a lower magnetic reference layer, an anti-ferromagnetic coupling layer, and an upper magnetic reference layer.

9. The mDMTJ structure of claim 7, wherein the first magnetic reference layer, the first tunnel barrier layer, the non-magnetic, spin-conducting metallic layer, the magnetic free layer, the second tunnel barrier layer, and the second magnetic reference layer have a same lateral dimension.

10. The mDMTJ structure of claim 1, wherein the second magnetic reference layer is located at a bottom portion of the mDMTJ structure, and the first magnetic reference layer is located at a top portion of the mDMTJ structure.

11. The mDMTJ structure of claim 10, wherein at least one of the first magnetic reference layer and the second magnetic reference layer comprises a lower magnetic reference layer, an anti-ferromagnetic coupling layer, and an upper magnetic reference layer.

12. The mDMTJ structure of claim 10, wherein the first magnetic reference layer, the first tunnel barrier layer, the non-magnetic, spin-conducting metallic layer, the magnetic free layer, the second tunnel barrier layer, and the second magnetic reference layer have a same lateral dimension.

13. A spin-transfer torque (STT) magnetic tunnel junction (MTJ) memory element comprising:
a modified double magnetic tunnel junction (mDMTJ) structure sandwiched between a first electrode and a second electrode, wherein the mDMTJ structure comprises a first magnetic reference layer, a first tunnel barrier layer having a first surface contacting a surface of the first magnetic reference layer, a non-magnetic, spin-conducting metallic layer having a first surface directly contacting a second surface of the first tunnel barrier layer which is opposite the first surface of the first tunnel barrier layer, a magnetic free layer having a first surface directly contacting a second surface of the non-magnetic, spin-conducting metallic layer which is opposite the first surface of the non-magnetic, spin-conducting metallic layer, a second tunnel barrier layer having a first surface contacting a second surface of the magnetic free layer which is opposite the first surface of the magnetic free layer, and a second magnetic reference layer having a first surface contacting a second surface of the second tunnel barrier layer which is opposite the first surface of the second tunnel barrier layer, wherein the first tunnel barrier layer has a first resistance-area product, RA, and the second tunnel barrier layer has a second RA, and wherein the first RA is at least 5 times lower than the second RA.

14. The STT MTJ memory element of claim 13, wherein the first RA is equal to, or less than, 1 Ohm-micron$^2$.

15. The STT MTJ memory element of claim 13, wherein the non-magnetic, spin-conducting metallic layer provides a low RA that is less than 1 Ohm-micron$^2$ to the first tunnel barrier layer, yet still supplies spin torque.

16. The STT MTJ memory element of claim 13, wherein the first tunnel barrier layer is composed of magnesium oxide (MgO), and the non-magnetic, spin-conducting metallic layer is composed of copper (Cu), or mainly of copper (Cu) with less than 1% other elements.

17. The STT MTJ memory element of claim 16, wherein the copper has an FCC 111 texture.

18. The STT MTJ memory element of claim 13, wherein the first tunnel barrier layer is composed of MgO, and the non-magnetic, spin-conducting metallic layer is composed of a copper nitride (CuN) alloy having a nitride content of less than 1 atomic percent, or a copper boron (CuB) alloy having a boron content of less than 20 atomic percent.

19. The STT MTJ memory element of claim 13, wherein the first magnetic reference layer is located at a bottom portion of the mDMTJ structure, and the second magnetic reference layer is located at a top portion of the mDMTJ structure.

20. The STT MTJ memory element of claim 19, wherein at least one of the first magnetic reference layer and the second magnetic reference layer comprises a lower magnetic reference layer, an anti-ferromagnetic coupling layer, and an upper magnetic reference layer.

21. The STT MTJ memory element of claim 19, wherein the first magnetic reference layer, the first tunnel barrier layer, the non-magnetic, spin-conducting metallic layer, the magnetic free layer, the second tunnel barrier layer, and the second magnetic reference layer have a same lateral dimension.

22. The STT MTJ memory element of claim 13, wherein the second magnetic reference layer is located at a bottom portion of the mDMTJ structure, and the first magnetic reference layer is located at a top portion of the mDMTJ structure.

23. The STT MTJ memory element of claim 22, wherein at least one of the first magnetic reference layer and the second magnetic reference layer comprises a lower magnetic reference layer, an anti-ferromagnetic coupling layer, and an upper magnetic reference layer.

24. The STT MTJ memory element of claim 22, wherein the first magnetic reference layer, the first tunnel barrier layer, the non-magnetic, spin-conducting metallic layer, the magnetic free layer, the second tunnel barrier layer, and the second magnetic reference layer have a same lateral dimension.

* * * * *